United States Patent
Koduri

(10) Patent No.: US 8,669,647 B2
(45) Date of Patent: *Mar. 11, 2014

(54) METHOD FOR SEMICONDUCTOR LEADFRAMES IN LOW VOLUME AND RAPID TURNAROUND

(75) Inventor: Sreenivasan K. Koduri, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 13/364,949

(22) Filed: Feb. 2, 2012

(65) Prior Publication Data

US 2012/0126385 A1    May 24, 2012

Related U.S. Application Data

(63) Continuation of application No. 12/549,613, filed on Aug. 28, 2009, now Pat. No. 8,133,763.

(51) Int. Cl.
    *H01L 21/00* (2006.01)
(52) U.S. Cl.
    USPC .................. 257/666; 257/676; 257/787
(58) Field of Classification Search
    USPC ........................... 257/666, 676, 787
    See application file for complete search history.

(56) References Cited

U.S. PATENT DOCUMENTS

| | | | | |
|---|---|---|---|---|
| 6,777,265 B2* | 8/2004 | Islam et al. | | 438/111 |
| 6,812,552 B2* | 11/2004 | Islam et al. | | 257/666 |
| 7,129,116 B2* | 10/2006 | Islam et al. | | 438/112 |
| 7,246,434 B1* | 7/2007 | Taylor et al. | | 29/852 |
| 7,504,721 B2* | 3/2009 | Chen et al. | | 257/724 |
| 7,531,893 B2* | 5/2009 | Koduri | | 257/676 |
| 7,622,332 B2* | 11/2009 | Islam et al. | | 438/123 |
| 7,723,129 B2* | 5/2010 | Koduri | | 438/3 |
| 7,754,973 B2* | 7/2010 | Shiomi et al. | | 174/126.2 |
| 7,790,500 B2* | 9/2010 | Ramos et al. | | 438/106 |
| 7,799,611 B2* | 9/2010 | Ramos et al. | | 438/112 |
| 8,017,410 B2* | 9/2011 | Koduri | | 438/3 |
| 8,133,763 B2* | 3/2012 | Koduri | | 438/123 |
| 2003/0203539 A1* | 10/2003 | Islam et al. | | 438/111 |
| 2003/0207498 A1* | 11/2003 | Islam et al. | | 438/120 |
| 2004/0002199 A1* | 1/2004 | Fukuyo et al. | | 438/460 |
| 2004/0126547 A1* | 7/2004 | Coomer | | 428/209 |
| 2005/0006737 A1* | 1/2005 | Islam et al. | | 257/676 |
| 2005/0263864 A1* | 12/2005 | Islam et al. | | 257/676 |
| 2007/0052076 A1* | 3/2007 | Ramos et al. | | 257/676 |
| 2008/0029907 A1* | 2/2008 | Koduri | | 257/784 |
| 2008/0054420 A1* | 3/2008 | Quah et al. | | 257/676 |
| 2008/0169020 A1* | 7/2008 | Shiomi et al. | | 136/252 |
| 2008/0258278 A1* | 10/2008 | Ramos et al. | | 257/676 |
| 2009/0186453 A1* | 7/2009 | Koduri | | 438/124 |
| 2010/0197045 A1* | 8/2010 | Koduri | | 438/3 |
| 2010/0295161 A1* | 11/2010 | Koduri | | 257/676 |
| 2011/0057298 A1* | 3/2011 | Ramos et al. | | 257/667 |
| 2012/0126383 A1* | 5/2012 | Koduri | | 257/666 |
| 2012/0126385 A1* | 5/2012 | Koduri | | 257/677 |

\* cited by examiner

*Primary Examiner* — Laura Menz

(74) *Attorney, Agent, or Firm* — Steven A. Shaw; Wade James Brady, III; Frederick J. Telecky, Jr.

(57) ABSTRACT

A leadframe for a QFN/SON semiconductor device comprising a strip of a first metal as the leadframe core with a plurality of leads and a pad. a layer of a second metal over both surfaces of the strip. There are sidewalls normal to the surfaces. The first metal exposed at the sidewalls and at portions of a surface of the pad.

4 Claims, 2 Drawing Sheets

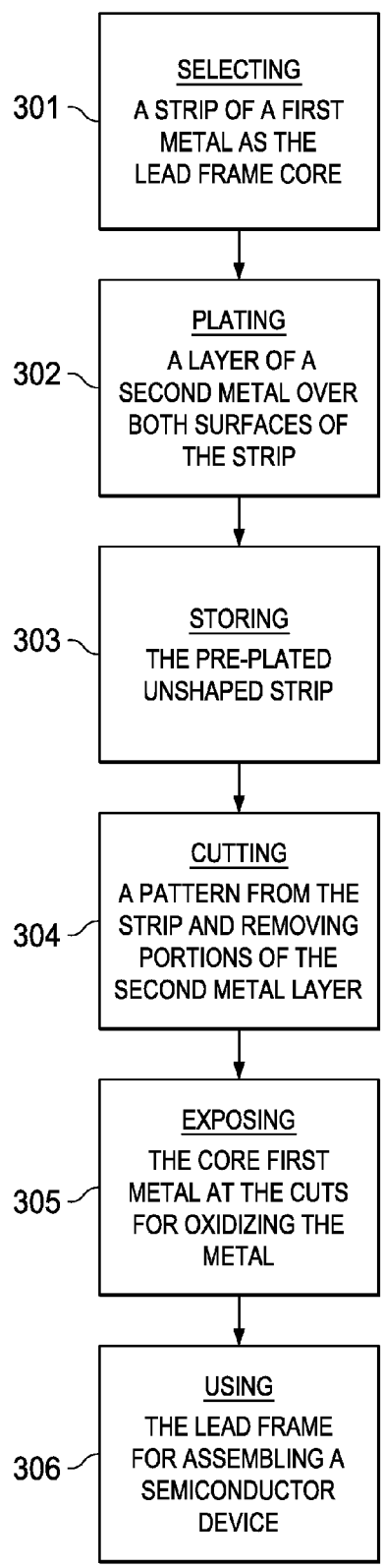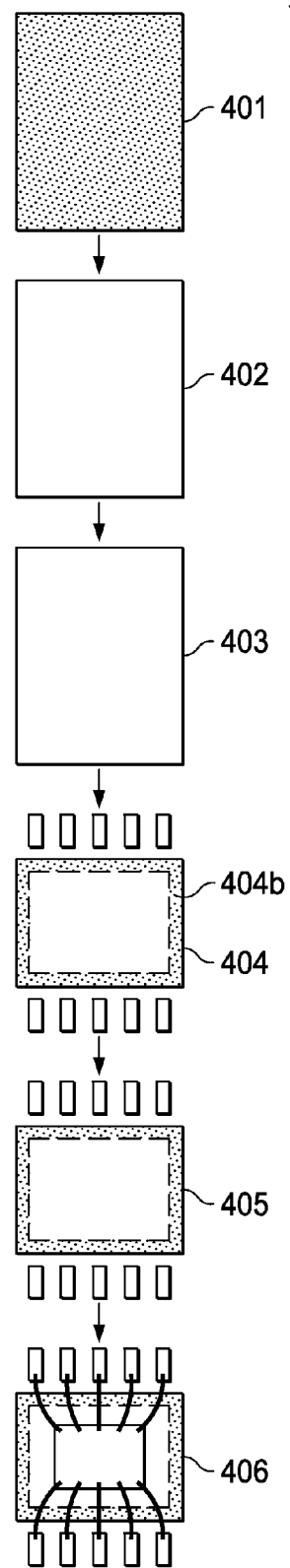
FIG. 3
FIG. 4

METHOD FOR SEMICONDUCTOR LEADFRAMES IN LOW VOLUME AND RAPID TURNAROUND

CROSS-REFERENCE TO RELATED APPLICATIONS

This application is a Continuation of and claims priority to U.S. application Ser. No. 12/549,613, filed on Aug. 28, 2009 hereby incorporated in its entirety herein by reference.

FIELD OF THE INVENTION

The present invention is related in general to the field of semiconductor devices and processes, and more specifically to the structure and fabrication method of semiconductor leadframes for low volume, yet high diversity Quad Flat No-Lead (QFN) and Small Outline No-Lead (SON) devices.

DESCRIPTION OF RELATED ART

The metallic leadframes used in semiconductor devices such as dual-in-line devices, surface mount devices, and Quad Flat No-Lead (QFN) and Small Outline No-Lead SON) devices, provide a pad for stable support of the semiconductor chip, and a plurality of leads to bring electrical conductors in close proximity of the chip. After attaching the chip onto the pad, the remaining gap between the chip and a lead is usually bridged by a thin wire attached in a bonding process; the wires are typically made of gold or copper. In order to protect the sensitive chip and wires from environmental disturbances such as moisture, scratches and light, the assembled chip and wires and portions of the leadframe are encapsulated in a package, which typically is produced by molding epoxy-based polymeric compounds around the sensitive device parts.

For reasons of easy manufacturing, it is common practice to fabricate the leadframes from a strip of flat metal sheet about 120 to 250 µm thick. Most commonly the sheets are made of a base metal such as copper or a copper alloy; alternatively, base metal sheets of aluminum or an iron-nickel alloy (Alloy 42) are in usage. The preferred fabrication methods are usually a chemical etching technique, supported by masks, or a stamping technique. The stamping technique offers the additional opportunity of pressing portions of the leadframe (for instance the pad) into a plane different from the original plane of the metal sheet, simplifying the tasks of wire bonding and positioning the chip pad for easy thermal heat flow into external heat sinks.

As an example, when leadframes for surface mount devices in the 8 to 200 pin range are to be fabricated in mass production, steel tools (stampers) for stamping the leadframes from metal strips are usually selected; they have a 6 to 8 week delivery time and cost between about $50 k to 500K dependent on the complexity of the selected pin count. A stamper can be used for about one million cutting stokes, before it has to be re-sharpened. The cycle of cutting and sharpening can be repeated between about 20 to 100 times in the lifespan of a stamper. A semiconductor assembly factory working at high production levels may operate with about 50 to 100 different stampers to produce several hundred million leadframes per month.

As another example, when leadframes for QFN or SON devices in the to pin range are to be fabricated in mass production, photomasks for chemical etching are usually selected; they have a 2 to 3 week delivery time and cost between about $1500 and 5000 dependent on the complexity of the selected pin count. A photomask can be used for the whole lifespan of the device-to-be-produced. A semiconductor factory working at high production levels may operate with more than 500 different photomasks to produce between 10 and 30 million leadframes per month.

Etched leadframes are between 5 to 10 times more expensive than stamped leadframes, because the production throughput is slower, the chemical tanks need constant control, and the metal chemically dissolved from the starting strip is lost; in contrast, the metal cut away from the strip by the stamper can be recycled.

A finished packaged semiconductor device includes parts of distinctly different materials. Proper functioning of the packaged device requires that the parts keep adhering to each other reliably so that the package does not delaminate in device operation and tests. For example, the adhesion between the epoxy-based polymeric molding compounds of the encapsulation and the leadframe is stronger, when the copper leadframe has a copper oxide surface rather than a pure copper surface; further, roughened metal surfaces enhance adhesion to polymeric materials compared to smooth surfaces. On the other hand, stitch-bonding gold wires to a silver-spot surface results in mechanically stronger connections than stitch-bonding to copper oxide. As another example, for connecting an external part to a copper lead using solder, the wetting of solder is facilitated by a layer of nickel on the copper, especially when the nickel is topped by a layer of a noble metal such as palladium or gold.

It is common practice to optimize leadframe attributes such as adhesion, bondability, and solderability by depositing additional metal layers on certain leadframe portions. After stamping or etching the leadframes from the sheet metal, a plating technique is used to deposit, for example, layers of nickel and a noble metal, or a layer of tin. The steps of stamping (or etching) and subsequent plating, including the step of applying masks, have been established in industry as reel-to-reel operations; the production is controllable and well suited for high volume production.

SUMMARY OF THE INVENTION

Applicant recognized that the current semiconductor leadframe manufacturing flow is directed for supporting high-volume products, but is not a good fit for the Analog type businesses, where more than 70% of products do not ramp up to high volumes. Analog products rather have to respond to rapidly changing requirements in QFN/SON designs, pin counts, and package sizes. For Analog products, it takes presently too much cycle time and investment money to tool up the stamping machines, photomasks, and etching baths for producing the leadframes.

Applicant solved the leadframe manufacturing problems of flexibility, turn-around time, spacing rules, and cost by changing the leadframe production steps from the conventional sequence: first cutting, then plating, to the new sequence: first plating, then cutting, and by simultaneously replacing the conventional fixed cutting tools (stamper, mask) with programmable methods (laser jet, water jet, electrical discharge machining). These computer-controlled techniques also improve the design rules for spacings and widths, creating denser interconnections for improved electrical functionality.

Furthermore, applicant recognized that the ongoing miniaturization of the device packages enhances the risk of delamination between leadframe and polymeric package and endangers device reliability. In addition, technical constraints, such as the spacing rules in the leadframe designs, are becoming increasingly restrictive, and the current leadframe fabrication flow cannot support effectively rapid prototyping.

Applicant discovered that the adhesion between leadframe and polymeric encapsulation can be strongly improved when the sidewalls of leadframe pad and segments have a surface configuration (roughness, metal oxides) with strong intermolecular affinity to polymeric compounds, independent of any plated metal layer on other leadframe surfaces.

Applicant solved the delamination problem of leadframe and polymeric compound concurrently with the leadframe manufacturing problem by the same change in leadframe production steps, namely first plating, then cutting. In the new leadframe manufacturing flow, a strip of a first metal (e.g., copper) is plated on both surfaces with a layer of a second metal (e.g., nickel). Then, the strip is cut with software-driven equipment (e.g., laser jet), whereby the first metal becomes exposed at the sidewalls of the cuts, and is readily oxidized. In addition, the machining is employed to remove the plated second metal from pre-selected leadframe surface areas (e.g., peripheral pad areas), creating and roughening additional zones (e.g., of copper oxide) for leadframe-to-package adhesion.

As further benefits, the leadframe fabrication flow of the invention reduces the cycle time for developing new leadframes and introducing new products and any needed initial investment. In addition, the new fabrication flow supports rapid prototyping and designing of experiments, which require multiple variations. Since the computer-numerical controlled tools offer an opportunity to remove certain additional portions of the plated second metal, special features and shapes can be created such as mold locks, mold flow controls, stress-relieving shapes, space for fitting external components, and precision shapes for electrical control.

BRIEF DESCRIPTION OF THE DRAWINGS

FIG. 3 shows a diagram of the process flow for fabricating metallic leadframes for semiconductor devices according to the invention.

FIG. 4 illustrates schematically top views of a metallic strip at the sequence of process steps described in FIG. 3, designed to produce a leadframe for a semiconductor QFN/SON device according to the invention.

DETAILED DESCRIPTION OF THE PREFERRED EMBODIMENTS

Figure 1:
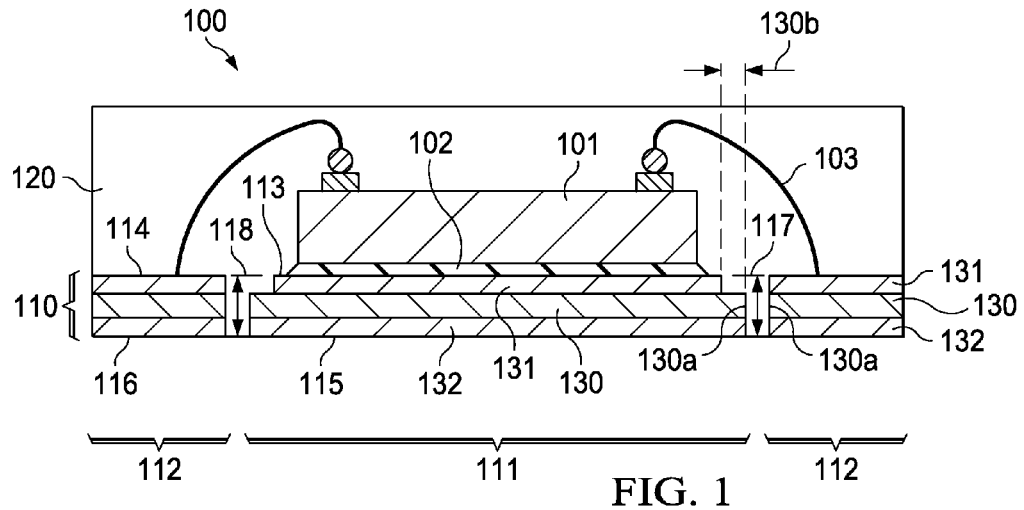
FIG. 1 shows a schematic cross section of a packaged QFN/SON-type semiconductor device with a leadframe fabricated according to the invention.

FIG. 1 depicts an exemplary semiconductor device of the Quad Flat No-Lead (QFN), or Small Outline No-Lead (SON) type, generally designated 100, as an embodiment of the invention. A semiconductor chip 101 is attached by a polymeric material 102 to the pad 111 of a metallic leadframe 110. Besides pad 111, the leadframe 110 has a plurality of leads 112. Pad 111 has a first surface 113 and a second surface 115, which is parallel to first surface 113. Leads 112 have a first surface 114 and a second surface 116, which is parallel to first surface 114. In FIG. 1, first surface 113 of the pad and first surface 114 of the leads lie in one plane, and second surface 115 of the pad and second surface 116 of the leads lie in another parallel plane. In other semiconductor devices, pad 111 and leads 112 may be offset relative to each other so that the pad first surface is in a plane different from but parallel to the plane of the lead first surfaces.

Pad 111 further has sidewalls 117 oriented about normal to the surfaces 113 and 115; leads 112 have sidewalls 118 oriented about normal to the surfaces 114 and 116. As FIG. 1 indicates, chip 101 is electrically connected to the leads by bonding wires 103. Furthermore, wires 103, chip 101, portions of first pad surface 113, and first surfaces 114 are packaged in a protective polymeric encapsulation compound 120.

As depicted in FIG. 1, pad 111 and each lead 112 of the leadframe 110 have a core 130 of a first metal, preferably copper or a copper alloy; other core metal options include aluminum and an iron-nickel alloy (Alloy 42). Core 130 is preferably in the thickness range from about 120 to 250 μm, but other QFN/SON devices have thinner core metals 130. As FIG. 1 illustrates, the core metal is exposed at the sidewalls of pad 111 and leads 112; these exposed core metal sections are designated 130a in FIG. 1. In the preferred embodiment, the exposed core metal 130a includes oxides of the first metal. As an example, when first metal is copper, exposed metal 130a includes copper oxides.

The core metal 130 is further exposed at area portions of the pad first surface 113; the width of these area portions is designated 130b in FIG. 1. In the preferred embodiment, the exposed core metal of width 130b includes oxides of the first metal. As an example, when first metal is copper, exposed metal 130b includes copper oxides. For the fabrication of width 130b see below.

Due to their chemical configuration (dangling bonds) and physical roughness, metal oxides enhance the adhesion between polymeric encapsulation compound 120 and the metallic leadframe 110. The reliability of the adhesion between the encapsulating compound and the encapsulated parts depends on the integrity in time and temperature of the interfaces between the compound and the parts. In first order, the interfaces have to guarantee mechanical interlocking of compound and parts strong enough so that different physical expansions and contractions in x- and y-directions based on different coefficients of thermal expansion can be prevented from disrupting the interlocking. With movements in x- and y-directions suppressed, movements in the z-direction (i.e., delamination) can also be inhibited. Volumetric expansion and contraction does not endanger the reliable coherence of the encapsulation compound and the encapsulated parts, especially the encapsulated portions of the leadframe.

As FIG. 1 further illustrates, pad 111 and each lead 112 have a layer of a second metal on both sides of the first metal core. The layer on the first surface side is designated 131, and the layer on the second surface side is designated 132. Layers 131 and 132 may each actually include a stack of two layers. The second metal comprises at least one metal selected from a group including nickel, tin, copper, palladium, silver, and gold. As an example, for nickel the preferred thickness range of layers 131 and 132 is between about 0.5 and 2.0 μm; an additional outermost layer of palladium is preferably about 0.1 μm or less, or an additional gold layer about 0.009 μm or less.

Figure 2:
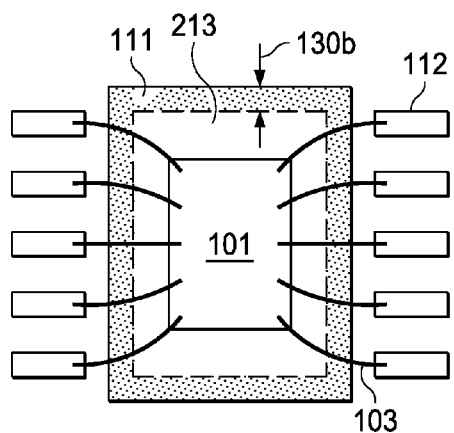
FIG. 2 illustrates a schematic top view of a semiconductor chip assembled on a QFN/SON-type leadframe fabricated according to the invention

As depicted in FIG. 2 by shading, the area portions of width 130b, which expose the first metal core in oxidized form, include the first surface of the pad 111, which is structured so that a frame of width 130b around the pad periphery exposes the first metal, while the central pad area 213 is covered by the layer (131 in FIG. 1) of the second metal. A portion or all of the central pad area 213 may be used to attach chip 101 to the leadframe pad 111.

Another embodiment of the invention is a method for fabricating a leadframe for semiconductor devices, especially for the QFN and SON device families. The process steps of the method are summarized in FIG. 3 and highlighted by the respective sketches of FIG. 4. The method starts with step 301 by selecting a strip of a first metal as the leadframe core metal; illustration in step 401 of FIG. 4. As mentioned, a preferred first metal is copper in strips of less than 120 to 250 µm thickness. The strip is preferably a sheet of metal with two flat sides, which is standardized at the assembly and test factories in terms of strip width, length, and thickness. In some factories, the strip is processed in a reel-to-reel operation.

The next step 302 (illustration 402) is the plating of the unshaped strip with a layer of a second metal over both sides of the strip. This step is in contrast to the conventional next step, in which the strip is first machined into the leadframe of the selected design, and then plated after the machining process. Preferably, the plating is performed as a so-called pre-plating step, meaning plating before encapsulation (such as molding, see below); alternatively, the strip may remain unplated for a later plating process after encapsulation (so-called post-plating). As mentioned above, the plating step may include the plating of a stack of two or more metal layers; the second metal comprises at least one metal selected from a group including nickel, tin, copper, palladium, silver, and gold. The preferred plating technique involves electrochemical deposition with tanks of chemical solutions; other techniques include electroless plating, chemical vapor deposition, sputtering, and evaporation. After the plating step, the strip may be stored (step 303, illustrated in 403) as an unshaped strip until the strip, or a quantity of it, is needed for machining (cutting) in the selected design.

In step 304, illustrated in 404, the leadframe is shaped; this step includes two actions: Cutting a leadframe pattern from the strip, and removing selected portions of the deposited second metal layer. The areas 404b of the selected portions are indicated in FIG. 404 by shading. The two actions may be performed in parallel, or concurrently. Step 304 includes a programmable mechanical machining technique operable to cut lines through the thickness of the strip and also to remove portions of the second metal layer from selected surface areas. Among the programmable machining techniques are: Computer numerical controlled tools (CNC); electrical discharge machining (EDM); programmable laser cutting; and programmable water jet cutting. CNC refers to the computer-guided automation of machine tools, operated by abstractly programmed commands encoded on a storage medium. EDM is a manufacturing process, whereby a wanted shape of a leadframe is obtained by using electrical discharges (sparks).

As a feature common to these software-driven machines, no special tools such as stampers for punching and photomasks for etching are needed. Consequently, the software-driven machines have very quick turn-around time and low fixed costs. The faster turn-around time reduces the technology and product introduction cycle time. The low fixed cost reduces the initial investment needed. As another advantage compared to punching or etching, software-driven machines such as CNC, EDM, and Lasers, improve significantly the design rules for spacing, widths, and pitches of the leadframes. These machines thus provide the tools for continued miniaturization of the semiconductor devices, an ongoing trend in the Analog product families, and for denser interconnections, improving the electronic functionality.

Since the strip has a core of a first metal and plated surface layers of a second metal, the cutting of the leadframe pattern from the pre-plated strip in step 304 exposes the core first metal at the cut lines (sidewalls of the cuts). Had the plating step be performed after the cutting step, as in the conventional leadframe fabrication flow, the cut lines (sidewalls) would be plated over and could not expose the core first metal. The usage of software-driven machine tools further allows removing selected portions of the deposited second metal layer from the surfaces in order to expose additional first metal areas. In step 305, illustrated in drawing 405, these exposed sections of the first metal core at the cut lines and on surface areas are oxidized. Some oxidation can be accomplished by exposure to ambient; enhanced oxidation is accomplished by exposing the leadframe to oxygen plasma. In addition to chemically creating metal oxides, the method used for cutting and removing roughens the exposed first metal surfaces. As stated above, both the chemical configuration and the physical roughness enhance the adhesion between the encapsulating polymeric compound and the encapsulated metallic leadframe. For product families such as the progressively miniaturized Analog QFN/SON devices, the gradual substitution of improved adhesion quality for shrinking adhesion areas is a technical advantage of the invention.

In step 306, illustrated in drawing 406, the leadframe is used for assembling a semiconductor device. Step 306 includes mounting a semiconductor chip of the leadframe pad and electrically connecting the chip to the respective leads, using bonding wires.

The flexibility and short cycle time of the computer control of fabricating leadframes allows the designing of experiments (DOE) for leadframes with large variations of design features for improving adhesion, avoiding delamination, locking-in molding compound, and reducing thermomechanical stress. Software-driven tools for machining pre-plated metal sheets can specifically solve two problem regimes where the failure risk increases with shrinking leadframe feature sizes, namely delamination and thermomechanical stress.

Figure 5:
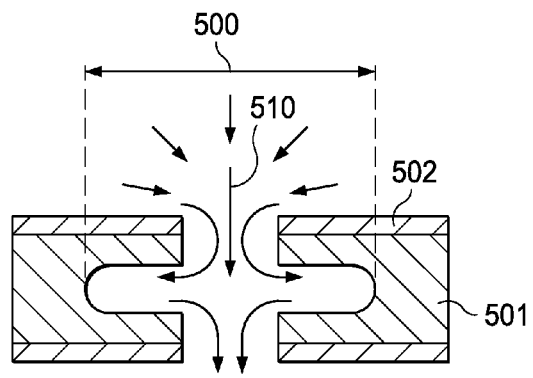
FIG. 5 shows a schematic cross section of a lead with a mechanical lock for encapsulation compound as fabricated by the method of the invention.

FIG. 5 shows a cross section through a lead made of a core first metal 501 and pre-plated on the surfaces by layers of a second metal 502. A mechanical lock 500 for encapsulation compound has been machined sidewise into the core first metal 501 by electrical discharges (sparks); the fabrication tool used is a software-controlled EDM. After drilling a via hole 510 through the stack of first and second metals and inserting an electrode embedded in a dielectric liquid, the metal removal from the leadframe core first metal occurs by a series of rapidly recurring current discharges between the electrode and the lead, separated by a dielectric liquid and subject to an electric voltage. When the electric field between the electrode and the lead becomes larger than dielectric strength (at reduced distance) and some current flows between electrode and lead, material is removed. New liquid flushes the debris and a new liquid dielectric breakdown can occur. Thereafter, the metal forming the space for lock 500 has a chance to oxidize. During the encapsulation process, a low viscosity polymeric precursor fills the space of lock 500 as symbolized by the arrows in FIG. 5. After polymerization of the precursor, the hardened encapsulation compound is firmly interlocked with the lead, and delamination of the encapsulation compound from the leadframe metal is prevented. The strong coupling of compound and metal is further enhanced by oxidizing the core metal surfaces inside the lock before filling the lock with polymeric compound.

Figure 6:
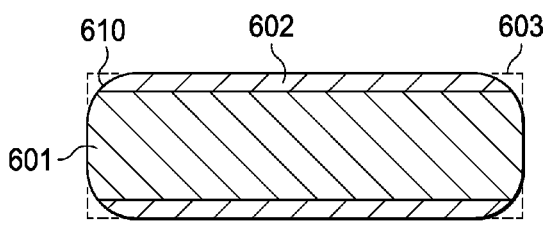
FIG. 6 shows a schematic cross section of a lead with rounded corners for reduction of thermomechanical stress as fabricated by the method of the invention.

The avoidance of thermomechanical stress, known to be concentrated at corners and edges, by the method of the invention is illustrated in FIG. 6. The FIG. depicts a cross section through a lead made of a core first metal 601 and pre-plated on the surfaces by layers of a second metal 602. After forming the lead by cutting it from a metal sheet, sharp edges 603 are typically created along the lead, shown in FIG. 6 at the intersection of the dotted lines (and extending perpendicular to the paper plane). Using computer-controlled laser jets along the sharp edges, the sharp edges are removed and rounded to the contours 610. As a consequence, thermomechanical stress no longer peaks at the edges; it does not have any higher value than at other locations along the lead.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to leadframes for QFN/SON type devices, but to any type of leadframe used for semiconductor devices. As another example, the invention can be applied to a sequence of process steps, wherein the plating step is performed after the device encapsulation.

As another example, the method can be extended to computer-controlled machining auxiliary features of the leadframe without the need for extra masks or stamps. For example, electrical resistance may be fine-tuned by local thinning of the leadframe metal and creating performance-controlling metallic shapes. The encapsulation compound may be locked-in by local grooves. Special channels can be created for preferential flowing of the encapsulation compound.

As another example, the method may be employed to custom-shape the metal of the leadframe to create local depressions suitable for inserting external components. As another example, the method may create stress-relieving leadframe shapes such as gull wings, which may even extend outside the device encapsulation compound.

It is therefore intended that the appended claims encompass any such modifications or embodiments.

I claim:

1. A leadframe comprising:
  a pad and a plurality of leads, each having a first and a parallel second surface, and sidewalls normal to the surfaces;
  the pad and each lead having a core of a first metal and a layer of a second metal different from the first metal on each surface, the first metal exposed at the sidewalls of the leads and at portions of the first surface of the pad;
  wherein the first surface of the pad is structured so that areas at the pad periphery expose the first metal, while the central pad area is covered by the layer of the second metal;
  further including oxides of the first metal at the exposed sidewalls and area portions of the first surface; and
  cavities formed inside the core first metal, the cavities operable as mechanical locks for polymeric compounds encapsulating the leadframe.

2. The leadframe of claim 1 wherein the first metal includes copper.

3. The leadframe of claim 2 wherein the second metal comprises at least one metal selected from a group including nickel, tin, copper, palladium, silver, and gold.

4. The leadframe of claim 1 further including rounded contours of the edges of the pad and the leads.

* * * * *